US008283219B2

(12) United States Patent
Kim et al.

(10) Patent No.: US 8,283,219 B2
(45) Date of Patent: Oct. 9, 2012

(54) ORGANIC LIGHT-EMITTING DISPLAY DEVICE AND METHOD FOR MANUFACTURING THE SAME

(75) Inventors: Mu-Hyun Kim, Suwon-si (KR); Sang-Il Park, Yongin-si (KR); Iee-Gon Kim, Anyang-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/005,878

(22) Filed: Jan. 13, 2011

(65) Prior Publication Data

US 2011/0117687 A1 May 19, 2011

Related U.S. Application Data

(62) Division of application No. 10/920,195, filed on Aug. 18, 2004, now Pat. No. 7,893,438.

(30) Foreign Application Priority Data

Oct. 16, 2003 (KR) .................................. 2003-72339
Nov. 22, 2003 (KR) ............................. 2003-0083391

(51) Int. Cl.
*H01L 21/00* (2006.01)
(52) U.S. Cl. ............. 438/151; 438/149; 257/59; 257/66
(58) Field of Classification Search .................. 438/149, 438/151, 479, 517; 257/57, 59, 66, 72, 347
See application file for complete search history.

(56) References Cited

U.S. PATENT DOCUMENTS

| 5,877,832 A | 3/1999 | Shimada |
| 5,933,204 A * | 8/1999 | Fukumoto ....................... 349/43 |
| 6,420,834 B2 | 7/2002 | Yamazaki et al. |
| 6,781,162 B2 | 8/2004 | Yamazaki et al. |
| 6,833,560 B2 | 12/2004 | Konuma et al. |
| 6,856,360 B1 | 2/2005 | Higuchi et al. |
| 7,006,177 B2 * | 2/2006 | Hirakata et al. .............. 349/110 |

FOREIGN PATENT DOCUMENTS

| CN | 1310480 | 8/2001 |
| KR | 10-1999-0072988 | 9/1999 |

(Continued)

OTHER PUBLICATIONS

Non-Final Office Action of U.S. Appl. No. 10/920,195 issued on Jul. 13, 2006.

(Continued)

*Primary Examiner* — Ori Nadav
(74) *Attorney, Agent, or Firm* — H.C. Park & Associates, PLC

(57) ABSTRACT

Provided is an organic light-emitting display device (OLED) and method of manufacturing the same. The OLED comprises a substrate and a thin film transistor, with source/drain electrodes, located at a predetermined area on the substrate. A passivation layer is located on the source/drain electrodes with a via hole exposing one of the source/drain electrodes. A first pixel electrode is located at the bottom of the via hole, electrically coupled to the exposed source/drain electrode, and extending onto the side wall of the via hole and the passivation layer. A planarization pattern fills the via hole in which the first pixel electrode is located and exposes the portion of the first pixel electrode on the passivation layer.

5 Claims, 5 Drawing Sheets

FOREIGN PATENT DOCUMENTS

| | | |
|---|---|---|
| KR | 10-2001-0065304 | 7/2001 |
| KR | 10-2001-0066877 | 7/2001 |
| KR | 10-2002-0054850 | 7/2002 |

OTHER PUBLICATIONS

Final Office Action of U.S. Appl. No. 10/920,195 issued on Nov. 21, 2006.
Non-Final Office Action of U.S. Appl. No. 10/920,195 issued on Oct. 23, 2007.
Chinese Office Action dated Dec. 21, 2007 for corresponding Chinese Application No. 200410082447.4.
Final Office Action of U.S. Appl. No. 10/920,195 issued on Apr. 10, 2008.
Non-Final Office Action of U.S. Appl. No. 10/920,195 issued on Sep. 17, 2008.
Final Office Action of U.S. Appl. No. 10/920,195 issued on Apr. 3, 2009.
Non-Final Office Action of U.S. Appl. No. 10/920,195 issued on Apr. 19, 2010.
Final Office Action of U.S. Appl. No. 10/920,195 issued on Aug. 9, 2010.
Notice of Allowance of U.S. Appl. No. 10/920,195 issued on Oct. 25, 2010.

* cited by examiner

ORGANIC LIGHT-EMITTING DISPLAY DEVICE AND METHOD FOR MANUFACTURING THE SAME

CROSS-REFERENCE TO RELATED APPLICATIONS

This application is a divisional of U.S. patent application Ser. No. 10/920,195, filed on Aug. 18, 2004, and claims the benefit of and priority from Korean Patent Applications No. 2003-72339, filed Oct. 16, 2003 and No. 2003-0083391, filed Nov. 22, 2003, which are hereby incorporated by reference for all purposes as if fully set forth herein.

BACKGROUND OF THE INVENTION

1. Field of the Invention

The present invention relates to an organic light-emitting display (OLED) and method of manufacturing the same and, more particularly, to an active matrix OLED and method of manufacturing the same.

2. Discussion of the Related Art

An (OLED) is an emissive display device that electrically excites fluorescent organic compounds to emit light. OLEDs are either passive-matrix type or active-matrix type, depending upon the method utilized to drive the display pixels, which are arranged in a matrix. The active-matrix OLED consumes less power than the passive-matrix OLED, thus providing the capability to create a larger display area at a higher resolution.

FIG. 1 shows a cross-sectional view of a conventional passive-matrix OLED and a method for manufacturing the same.

Referring to FIG. 1, a buffer layer 105 is formed on an insulating substrate 100. Utilizing a conventional method, a driving thin film transistor (TFT) is then formed on buffer layer 105 by sequentially forming an active layer 110, a gate insulating layer 120, a gate electrode 130, an interlayer 140, and source/drain electrodes 145. A planarization layer 155 is formed on the entire surface of the substrate, which includes the driving TFT. A via hole 150 is then formed in the planarization layer 155 to expose any one of the source/drain electrodes 145.

A pixel electrode 170 is then formed within the via hole 150 to contact the exposed source/drain electrodes 145. Since the pixel electrode 170 is formed along the bottom and side wall of the via hole 150, it has a recessed region in the via hole 150.

A pixel defining layer 175, formed to cover pixel electrode 170, has an opening 178 spaced from the via hole 150, at a predetermined distance, in order to expose pixel electrode 170. An organic emission layer 180 is formed on the pixel electrode 170, exposed by the opening 178, and an opposite electrode 190 is formed on the organic emission layer 180, thereby forming an organic light-emitting diode. This organic light-emitting diode is connected to, and driven by, the driving TFT through the via hole 150.

With this method of manufacturing an OLED, the pixel defining layer 175 is formed to cover the pixel electrode 170 recessed in the via hole 150. Here, the pixel defining is layer 175 has an opening 178 spaced from the via hole 150 at a predetermined distance. The organic emission layer 180 is not located over the recessed portion of pixel electrode 170 in order to prevent recession and deterioration of the organic emission layer 180. However, because the opening 178 is formed and spaced from the via hole 150 at a predetermined distance, an opening area (P), which is defined by the opening 178, is limited, and the resultant aperture ratio of the opening area (P) to the unit pixel area is also limited. These limitations are greater in a top-emitting OLED, which emits light from organic emission layer 180 in a direction away from the substrate 100.

SUMMARY OF THE INVENTION

Accordingly, the present invention is directed to an OLED and a method of manufacturing an OLED that substantially obviates one or more of the problems due to limitations and disadvantages of the related art.

The present invention provide an OLED and a method for manufacturing an OLED that prevents a limitation of the aperture ratio due to a via hole.

Additional features and advantages of the invention will be set forth in the description which follows, and in part will be apparent from the description, or may be learned by practice of the invention.

To achieve these and other advantages and in accordance with of the present invention, as embodied and broadly described, one aspect of the present invention provides an OLED comprising a substrate and a TFT, with source/drain electrodes, located at a predetermined area on the substrate. A passivation layer is located on the source/drain electrodes with a via hole exposing one of the source/drain electrodes. A first pixel electrode is located at the bottom of the via hole, electrically coupled to the exposed source/drain electrode, and extending onto the side is wall of the via hole and the passivation layer. A planarization pattern fills the via hole in which the first pixel electrode is located and exposes the portion of the first pixel electrode on the passivation layer.

The present invention also provides a method for manufacturing such an OLED. It forms a thin film transistor, having source/drain electrodes, at a predetermined area on the substrate. A passivation layer is formed on the source/drain electrodes and a via hole is formed to expose one of the source/drain electrodes. A first pixel electrode is formed on the exposed source/drain electrode, the side wall of the via hole, and the passivation layer. A planarization layer is formed on the first pixel electrode and a planarization pattern is formed to fill the via hole in which the first pixel electrode is located and expose the portion of the first pixel electrode that is on the passivation layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to an embodiment of the present invention, example of which is illustrated in the accompanying drawings.

Figure 1:
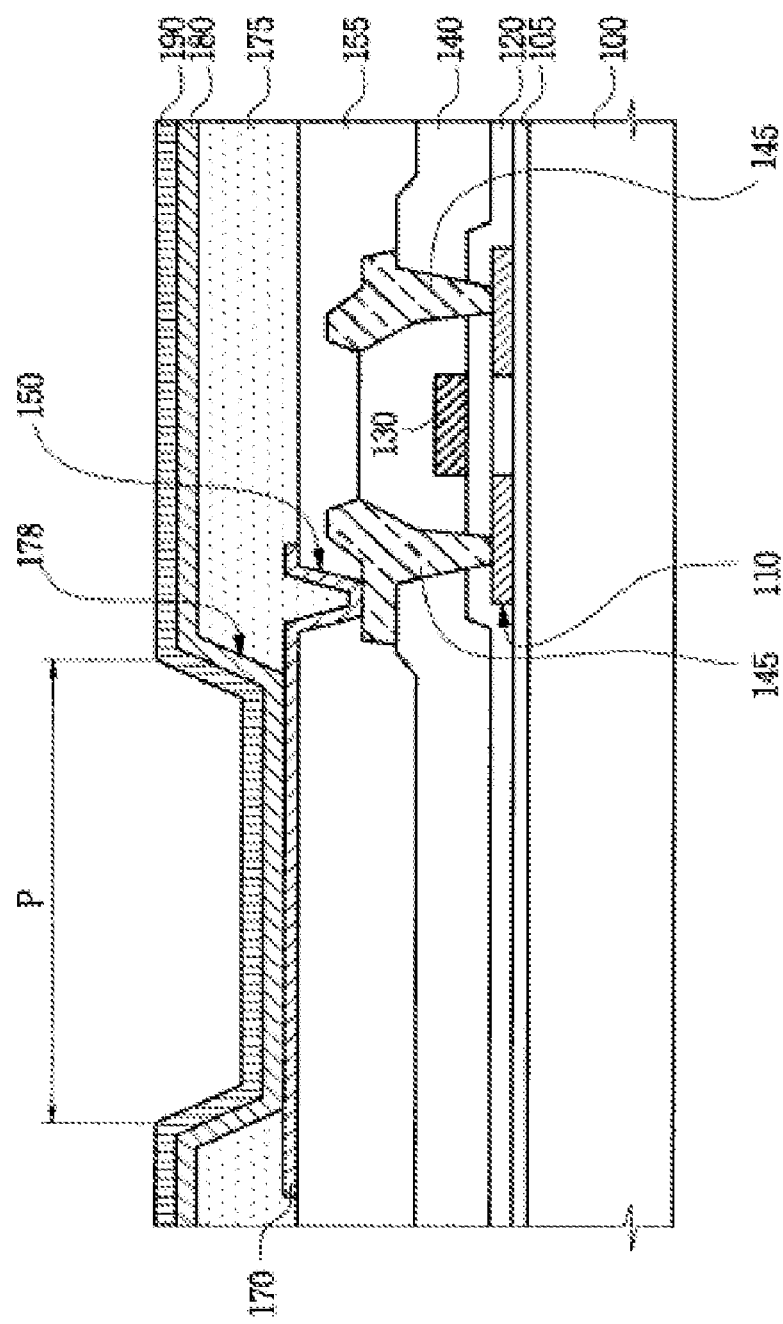
FIG. 1 shows a cross-sectional view of a conventional passive-matrix OLED and method for manufacturing the same.
Figure 2A:
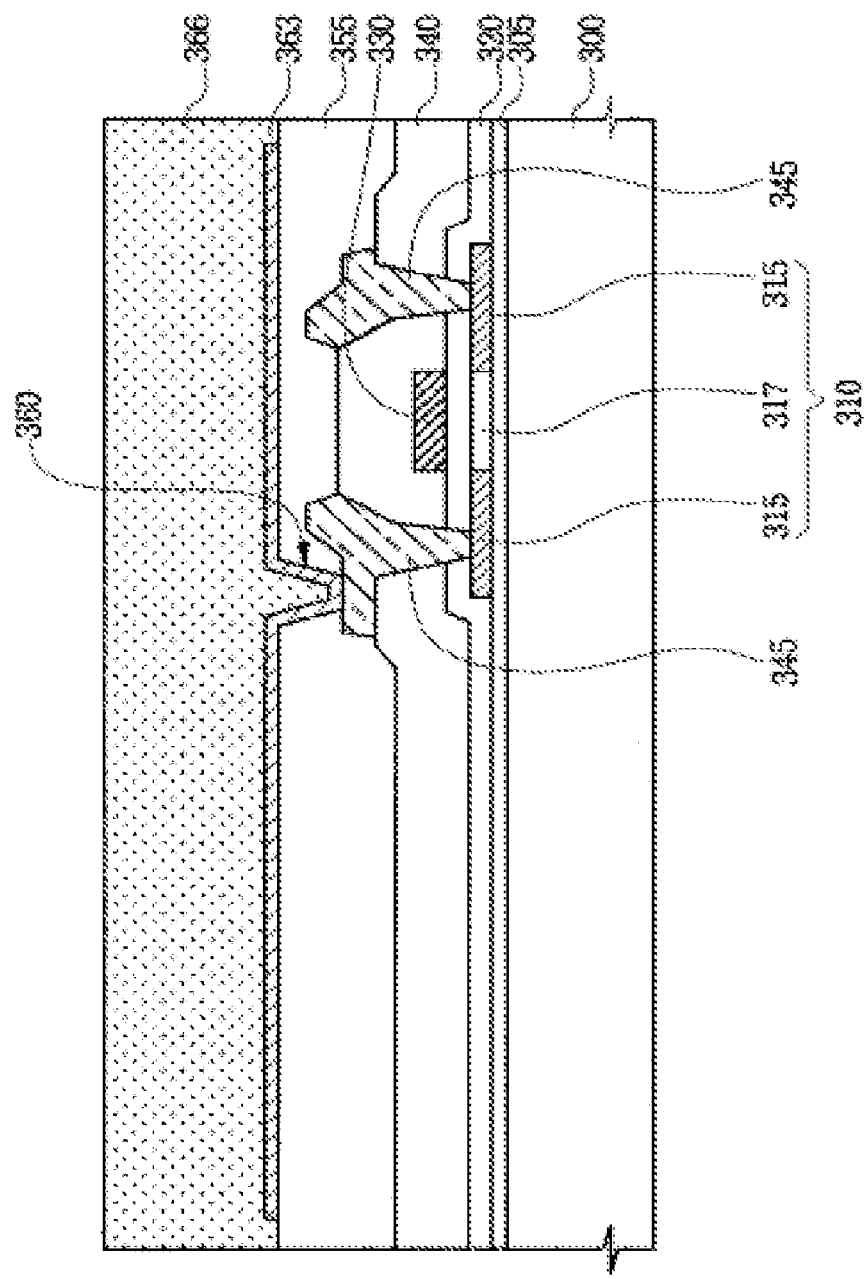
FIGS. 2A, 2B, and 2C show cross-sectional views of an active-matrix OLED and method for manufacturing the same in accordance with an exemplary embodiment of the present invention.
Figure 2B:
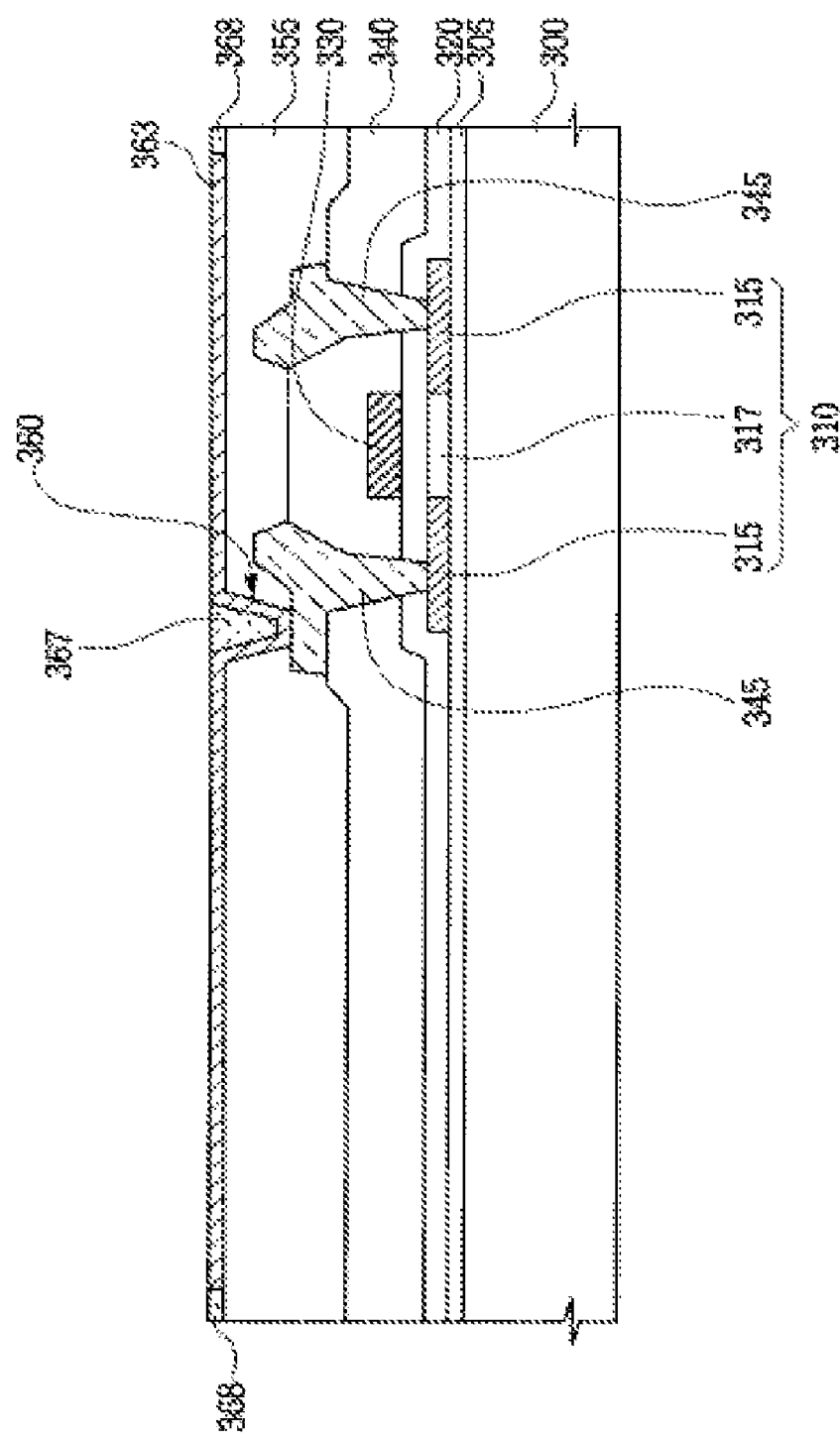
Figure 2C:
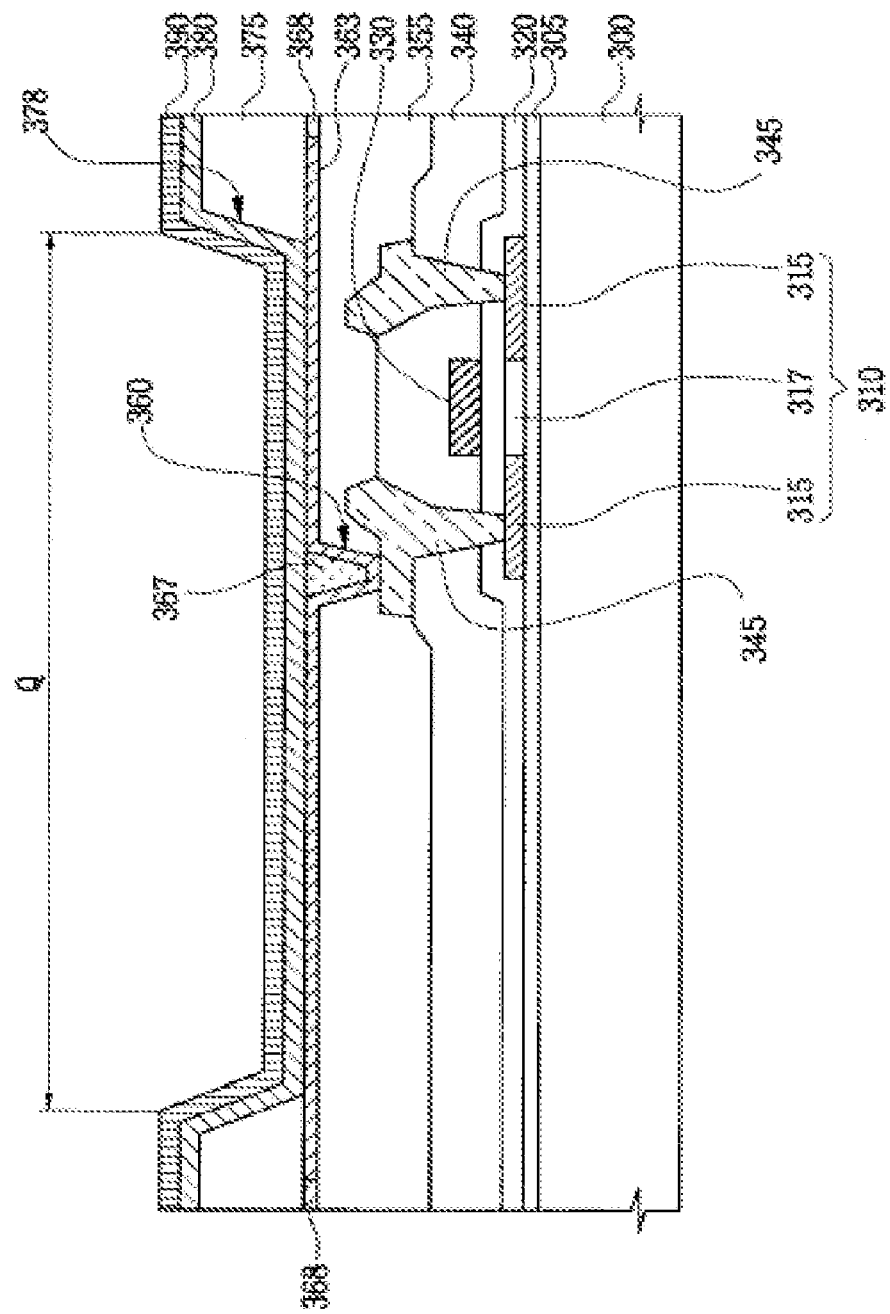

FIGS. 2A, 2B, and 2C show cross-sectional views of an OLED and method for manufacturing the same in accordance with an exemplary embodiment of the present invention. The OLED includes at least one unit pixel, which is shown in the cross sectional views.

FIG. 2A shows a substrate 300, which may be an insulating substrate. A buffer layer 305 is formed on the substrate 300 to protect a thin film transistor, which is formed in a subsequent process, from an impurity such as an alkali metal ion outdiffused from the substrate. It can be formed of a silicon oxide layer, a silicon nitride layer or a double layer stacking the two layers.

An active layer 310 is formed on a predetermined area of the buffer layer 305. The active layer 310 includes source/drain regions 315 and a channel region 317 interposed between the source/drain regions 315. The active layer 310 can be formed of an amorphous silicon layer, a polycrystalline silicon layer, or other similar substance. A gate insulating layer 320 is formed on the active layer 310 and buffer layer 305, and a gate electrode 330 is formed on the gate insulating layer 320 to correspond to the channel region 317. An interlayer 340 is formed on the gate electrode 330 and the gate insulating layer 320, and contact holes, which expose source/drain regions 315, are formed in the interlayer 340 and the gate insulating layer 320.

Source/drain electrodes 345, which are connected with the source/drain regions 315 exposed by the contact holes, are then formed on the interlayer 340. A passivation layer 355 is formed on the source/drain electrodes 345, and a via hole 360, which exposes one of the is source/drain electrodes 345, is then formed in the passivation layer 355.

Then, a first pixel electrode 363 is formed on the passivation layer 355 that the via hole 360 was just formed in. The first pixel electrode can be formed by various processes including depositing conductive material using a sputtering process, a vacuum deposition process, or a shadow mask, and then patterning that deposited conductive material using a photolithography process. The first pixel electrode 363 is coupled with the source/drain electrode 345 by the via hole 360, and it is also located on side wall of the via hole 360 and on the passivation layer 355. Further, the first pixel electrode 363 may be located over any portion of the area which the thin film transistor is formed on.

The first pixel electrode 363 may be formed as an anode or a cathode. If formed as anode, it is formed using ITO (Indium Tin Oxide) or IZO (Indium Zinc Oxide), which are transparent conductive layers. Alternatively, if the first pixel electrode 363 is formed as the cathode, it is formed using one material selected from the group consisting of Al, Cr, AlNd and Ni.

A planarization layer 366 is then formed on the first pixel electrode 363 at a thickness that ensures that at least the via hole 360 is completely filled. The planarization layer 366 can reduce topology generated by its underlying pattern, and it may be formed of one material selected from the group consisting of benzocyclobutene (BCB), phenolic resin, acryl resin, polyimide resin, SOG, and other similar material. The planarization layer 366 may be formed using a wet coating method.

Referring to FIG. 2B, the planarization layer 366 (as shown in FIG. 2A) is etched until the portion of the first pixel electrode 363 on the passivation layer 355 is exposed. Accordingly, a planarization pattern 367 filling the via hole 360, which the first pixel electrode 363 is located in, is formed. Planarization patterns 368 are also formed at each end of the pixel electrode 363 on the portion of the passivation layer not covered by the pixel electrode 363. It is preferable that the upper surface of the planarization pattern 367 be coplanar with the upper portion of the first pixel electrode 363. Similarly, it is preferred that the planarization patterns 368 be coplanar with pixel electrode 363. Alternatively, the planarization patterns 368 may be at a lower plane than pixel electrode 363. The etching may be performed using a dry etching method. Furthermore, etching gas used in the dry etching method may be mixed gas of $SF_6$ and $O_2$, and the volume ratio of the gases may be 5:3, respectively.

Referring to FIG. 2C, a pixel defining layer 375 may be formed on the substrate having the planarization pattern 367. The pixel defining layer 375 has an opening 378 that exposes at least the first pixel electrode 363. An organic functional layer 380, which has at least an organic emission layer, is formed on the exposed portion of first pixel electrode 363. The organic functional layer 380 can further comprise a charge injecting layer, a charge transporting layer, or a charge injecting layer and a charge transporting layer.

Because the planarization pattern 367 fills the via hole 360, the organic functional layer 380 can now be formed on the substrate, including on the portion where the via hole 360 is located. Accordingly, deterioration generated by possible bending of the organic functional layer 380 is controlled by the planarization pattern 367. Thus the opening 378 can be formed without regard to the position of the via hole 360. In other words, the opening 378 can be located not only over the via hole 360, but also over the area where the thin film transistor is formed. As a result, the opening area (Q), which is defined by the opening 378, can be expanded and, correspondingly, the aperture ratio of the opening area to the unit pixel area can be increased. The improvement is more effective in a top-emitting OLED that emits light from the organic emission layer, which is formed in a subsequent process, in a direction away from the substrate. This improvement may be enhanced when the upper surface of the planarization pattern 367 is coplanar with the upper surface of the portion of the first pixel electrode 363.

An opposite electrode 390 is next formed on the organic functional layer 380. The opposite electrode 390 is formed as cathode when the first pixel electrode 363 is formed as anode, and it is formed as anode when the first pixel electrode 363 is formed as cathode.

Figure 3:
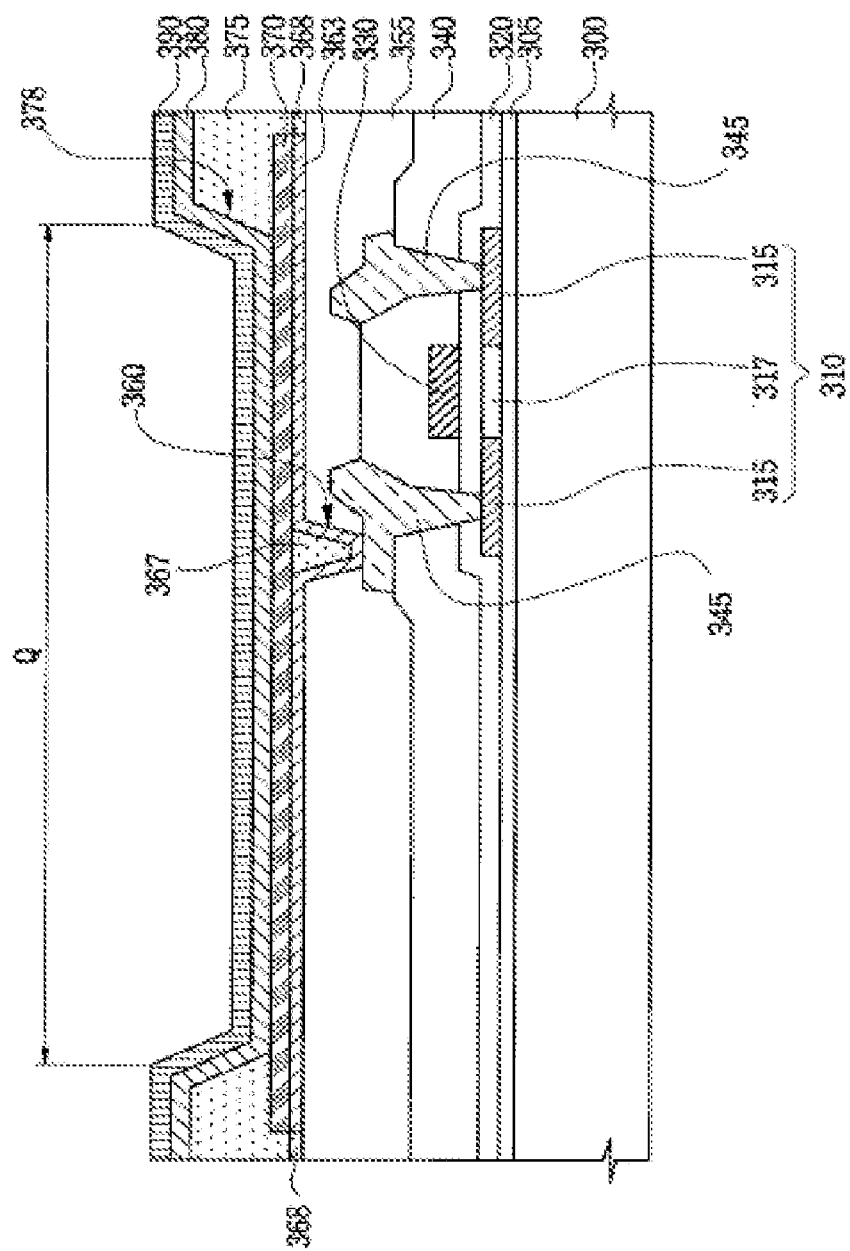
FIG. 3 shows a cross sectional view of an active-matrix OLED and a method for manufacturing the same in accordance with another exemplary embodiment of the present invention.

FIG. 3 shows a cross-sectional view of an OLED and method for manufacturing the same in accordance with another exemplary embodiment of the present invention. The OLED according to this second exemplary embodiment is the same as the OLED of the previous exemplary embodiment except as follows.

Referring to FIG. 3, a second pixel electrode 370 is formed on the first pixel electrode 363 before the pixel defining layer 375 is formed. The second pixel electrode 370 is located on the planarization pattern 367 and the first pixel electrode 363. The second pixel electrode 370 is electrically coupled to the first pixel electrode 363 and, through the first pixel electrode 363, to the source/drain electrode 345. The electrical connection between the organic functional layer 380 and the first pixel electrode 363 can be improved by the second pixel electrode 370. Preferably, the second pixel electrode 370 is formed on the entire surface of the first pixel electrode 363. Furthermore, as with the first pixel electrode 363, the second pixel electrode 370 may be formed over the any portion of the area where the thin film transistor is formed.

The second pixel electrode 370 is formed as an anode or a cathode. If formed as the anode, the first pixel electrode 363 and the second pixel electrode 370 are formed using ITO (Indium Tin Oxide) or IZO (Indium Zinc Oxide) or other similar materials, which are transparent conductive layers. Alternatively, the first pixel electrode 363 can be formed using one material selected from the group consisting of Al, Ag, MoW, AlNd and Ti, and the second pixel electrode 370 can be formed using ITO or IZO. Preferably, the first pixel electrode 363 is formed using AlNd. In this case, the first pixel electrode 363 may work as a reflecting plate.

On the other hand, if the second pixel electrode 370 is formed as cathode, it is formed of conductive material, such as Al, Ni, Cr, AlNd, and other similar materials. The first pixel electrode 363 is formed of such materials as Al, Ag, MoW, AlNd, Ti and other similar materials.

As described above, according to the exemplary embodiments of the present invention, the organic functional layer can also be formed over the via hole by forming the planarization pattern filling that via hole. This permits an increase in the aperture ratio because the opening of the pixel defining layer may be formed without regard to the position of the via hole. Furthermore, adding the second pixel electrode on the first pixel electrode enhances the electrical connection between the first pixel electrode and the organic functional layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing an organic light-emitting display device, comprising:
    forming a thin film transistor having source/drain electrodes, on a substrate;
    forming a passivation layer on the source/drain electrodes;
    forming a via hole exposing one of the source/drain electrodes, in the passivation layer;
    forming a first pixel electrode on the passivation layer, the first pixel electrode being coupled to the exposed source/drain electrode and extending to a side wall of the via hole;
    forming a planarization layer on the first pixel electrode;
    forming a first planarization pattern filling the via hole in which the first pixel electrode is located and exposing a portion of the first pixel electrode on the passivation layer;
    forming a second planarization pattern at each end of the first pixel electrode; and
    forming a pixel defining layer on the first pixel electrode, the pixel defining layer having an opening exposing a portion of the first pixel electrode,
    wherein an upper surface of the second planarization pattern is coplanar with an upper surface of the first pixel electrode, and
    wherein the pixel defining layer overlaps a second planarization pattern, and the opening overlaps the via hole.

2. The method of claim 1, further comprising: forming a second pixel electrode on the planarization pattern and the exposed portion of the first pixel electrode.

3. The method of claim 1, wherein the planarization layer is formed using a wet coating process.

4. The method of claim 1, wherein the planarization pattern is formed so that upper surfaces of both the planarization pattern and the portion of the first pixel electrode on the passivation layer are coplanar.

5. The method of claim 4, wherein the upper surfaces of both the planarization pattern and portion of the first pixel electrode on the passivation layer are made coplanar by an etchback method.

* * * * *